United States Patent [19]

Bashir et al.

[11] Patent Number: 5,451,532

[45] Date of Patent: Sep. 19, 1995

[54] PROCESS FOR MAKING SELF-ALIGNED POLYSILICON BASE CONTACT IN A BIPOLAR JUNCTION TRANSISTOR

[75] Inventors: Rashid Bashir, Santa Clara; Francois Hebert, Sunnyvale, both of Calif.

[73] Assignee: National Semiconductor Corp., Santa Clara, Calif.

[21] Appl. No.: 273,530

[22] Filed: Jul. 11, 1994

Related U.S. Application Data

[62] Division of Ser. No. 213,878, Mar. 15, 1994.

[51] Int. Cl.$^6$ ............................................. H01L 21/8222
[52] U.S. Cl. ........................................ 437/31; 437/164; 437/228; 437/200; 437/909; 148/DIG. 10
[58] Field of Search ............... 437/31, 164, 200, 909; 148/DIG. 10, DIG. 11, DIG. 123, DIG. 124

[56] References Cited

U.S. PATENT DOCUMENTS

| | | | |
|---|---|---|---|
| 4,188,707 | 2/1980 | Asano et al. | 437/162 |
| 4,577,392 | 3/1986 | Peterson | 437/44 |
| 4,625,391 | 12/1986 | Sasaki | 437/200 |
| 4,697,333 | 10/1987 | Nakahara | 437/20 |
| 4,753,709 | 6/1988 | Welch et al. | 156/643 |
| 4,971,922 | 11/1990 | Watabe et al. | 437/44 |
| 4,980,738 | 12/1990 | Welch et al. | 357/34 |
| 4,980,739 | 12/1990 | Favreau | 357/34 |
| 5,200,352 | 4/1993 | Pfiester | 437/44 |
| 5,254,490 | 10/1993 | Kondo | 437/44 |
| 5,256,586 | 10/1993 | Choi et al. | 437/44 |
| 5,320,974 | 6/1994 | Hori et al. | 287/44 |

FOREIGN PATENT DOCUMENTS

| | | | |
|---|---|---|---|
| 0123724 | 7/1983 | Japan | 437/31 |
| 61-20369 | 1/1986 | Japan | 437/41 |
| 61-20370 | 1/1986 | Japan | |
| 63-12168 | 1/1988 | Japan | |
| 3-120835 | 5/1991 | Japan | 437/44 |
| 5-74814 | 3/1993 | Japan | 437/912 |

OTHER PUBLICATIONS

Yamaguchi, et al., "0.5-μm Bipolar Technology Using a New Base Formation Method: SSTIC," IEEE 1993 Bipolar Circuits and Technology Meeting 4.2, 1993, pp. 63–66.

Iranmanesh, et al., "A 0.8-μm Advanced single-Poly BiCMOS Technology for High-Density and High-Performance Applications," IEEE Journal of Solid-State Circuits, vol. 26, No. 3, Mar., 1991, pp. 422–426.

Yamaguchi, et al., "Process Integration and Device Performance of a Submicrometer BiCMOS with 15-GHzf, Double Poly-Bipolar Devices," IEEE Transactions on Electron Devices, vol. 36, No. 5, May, 1989, pp. 890–896.

Chiu, et al., "Non-overlapping Super Self-Aligned BiCMOS with 87ps Low Power ECL," IEDM, 1988, pp. 752–755.

Primary Examiner—Brian E. Hearn
Assistant Examiner—Tuan Nguyen
Attorney, Agent, or Firm—H. Donald Nelson; David T. Millers; Richard J. Roddy

[57] ABSTRACT

A bipolar transistor in accordance with the invention includes a polysilicon base contact (607A) which is self-aligned with a polysilicon emitter (303). The polysilicon emitter is formed from a first polysilicon layer overlying an intrinsic base region (502) in a substrate (201). An extrinsic base (504) in the substrate is in contact with the intrinsic base and is self-aligned with a spacer (406) adjacent to the emitter. The polysilicon base contact is formed from a second polysilicon layer (407) in contact with the extrinsic base and overlying the emitter. A second sidewall spacer (508) is formed on the second polysilicon layer on step caused by the emitter. A protective layer (509, 510) formed on portions of the second polysilicon layer protects the base contact when the second spacer and the underlying portion of the second polysilicon layer are removed. The separation between the polysilicon base contact and the polysilicon emitter is controlled by the thickness the second polysilicon layer and the thickness of the spacers so that the base contact is self-aligned with a fixed separation from the emitter. Layer and spacer thicknesses define separation between the emitter and the base contact and permit sub-micron active regions in the substrate.

19 Claims, 4 Drawing Sheets

PROCESS FOR MAKING SELF-ALIGNED POLYSILICON BASE CONTACT IN A BIPOLAR JUNCTION TRANSISTOR

This application is a division of application Ser. No. 08/213,878, filed Mar. 15, 1994.

CROSS-REFERENCES TO RELATED APPLICATIONS

This application is related to and incorporates by reference U.S. patent application Ser. No. 08/198,170 by Richard P. Ciari, entitled "Low Temperature Process for Growing Thermal Oxide Layers" and U.S. patent application Ser. No. 08/213,360 by Rashid Bashir and Francois Hebert, entitled "Self-aligned Source/Drain Polysilicon or Polysilicide Contacts in Field Effect Transistors"; both assigned to the same assignee as the present application.

BACKGROUND OF THE INVENTION

1. Field of the Invention

This invention relates to bipolar transistors and processes for making bipolar transistors and in particular relates to a self-aligned polysilicon, polysilicide, or silicide base contact in a bipolar junction transistor.

2. Description of Related Art

Bipolar transistors are common integrated circuit elements having many uses. FIG. 1 shows an example of a prior art NPN bipolar transistor 100 having a base 102, an emitter 103, and a collector 104 formed in a silicon substrate 101. Base 102 has P type doping which is the opposite doping type from the N type doping used in emitter 103, collector 104, and substrate 101. Accordingly, junctions are formed between base 102 and emitter 103 and between base 102 and substrate 101. Metal contacts 106, 107, and 108 respectively contact base 102, emitter 103, and collector 104 through openings 109 in an insulating layer 105 so that bipolar transistor 100 can be connected to other circuit elements. In forward active mode, voltages applied to emitter 103 and collector 104 tend to forward bias the junction between base 102 and emitter 103 and reverse bias the junction between base 102 and substrate 101, and as is well known, a base current through contact 106 controls much larger emitter and collector currents through contacts 107 and 108 respectively.

Several manufacturing constraints limit the minimum size of transistor 100. For example, lithography and etching techniques limit the minimum size of openings 109. Accordingly, active regions in substrate 101 such as emitter 103 must be larger than the minimum opening size, otherwise the emitter contact 107 would also could contact base 102. Lithography and etching techniques also limit the separations between metal contacts 106 to 108 (and between base 102, emitter 103, and collector 104). The separations must be sufficient to permit etching which electrically isolates metal contacts 106 to 108 from each other. Further, since metal contacts 106 to 108 and openings 109 are formed using different masks, the separation between openings 109 (and between base 102, emitter 103, and collector 104) must be large enough that the expected misalignment between the mask which defines openings 109 and the mask which defines contacts 106 to 108 still provides working contacts.

Accordingly, structures and manufacturing processes are needed which reduce the size of active regions in bipolar transistors.

SUMMARY OF THE INVENTION

In accordance with the present invention, bipolar transistors and processes for forming bipolar transistors are provided. A typical bipolar transistor in accordance with the invention includes a polysilicon base contact which is self-aligned with fixed separation from a polysilicon emitter. A first polysilicon layer forms the emitter of the bipolar transistor, and a second polysilicon layer forms the polysilicon base contact. An extrinsic base which extends beyond the base contact toward the emitter links the base contact to an intrinsic base underlying the emitter. The base contact may be extended over field oxidation areas where metal contacts are formed. Because the metal contacts are away from the active regions, design rules for the transistor may be relaxed, or alternatively, smaller active regions may be formed.

A process for forming the self-aligned base contact uses a spacer formed on a sidewall of a step caused in the second polysilicon layer by the emitter. A protective layer is formed on portions of the second polysilicon layer not covered by the spacer. By selectively removing the spacer and the underlying portion of the second polysilicon layer, a portion of the second polysilicon layer protected by the protective layer is isolated from the emitter and forms the base contact. The separation between the polysilicon base contact and the polysilicon emitter is controlled by the thickness the second polysilicon layer and the thickness of the spacer.

A spacer formed on a sidewall of the emitter before the second polysilicon layer can provide additional separation. The separation between the base contacts and the emitter is not subject to alignment error between masks because the spacers which define the separation are self-aligned with the emitter. Improved control of the separation is provided over the prior art because in accordance with the present invention, control of separation depends on the ability to form submicron layer thicknesses rather than submicron lithography.

Additionally, the process for forming transistors in accordance with the present invention contains many of the processing steps and layers used in forming field effect transistors as disclosed in co-filed U.S. patent application entitled "Self-aligned Source/Drain Polysilicon or Polysilicide Contacts in Field Effect Transistors", incorporated by reference above Accordingly, the processes disclosed may be easily incorporated into a Bi-CMOS process for fabrication of integrated circuits.

One embodiment in accordance with the invention is a process which includes: forming an emitter from a layer overlying a portion of a semiconductor surface; forming a spacer adjacent to a sidewall of the emitter; forming an extrinsic base in the semiconductor surface; depositing a conductive layer over the extrinsic base, the spacer, and the emitter; forming a second spacer on a sidewall of the step of the emitter; forming a protective layer on regions of the conducting layer not covered by the second spacer; removing the second spacer to expose portions of the conductive layer covered by the second spacer; and removing the exposed portion of the conductive layer to leave a portion of the conductive layer in contact with the extrinsic base and electrically isolated from the emitter.

Typically, the semiconductor surface is a surface of a silicon substrate, and the emitter and conductive layer are doped polysilicon layers of opposite doping types formed overlying the silicon substrate. Typically, the extrinsic base is initially formed in the silicon substrate by ion implantation and/or diffusion using either the emitter alone or the emitter and the first spacer as a mask, and the dopant concentration of the extrinsic base is increased by diffusion of dopants from the conductive layer. The materials of the second spacer and the protective layer are chosen so that a selected etch removes the second spacer but leaves the protective layer intact. Typically, the second spacer is silicon nitride, and the protective layer is silicon dioxide.

An embodiment of a bipolar transistor formed in accordance with the present invention includes: a semiconductor surface having an intrinsic base formed therein; an emitter overlying the intrinsic base; an insulating spacer adjacent to a sidewall of the emitter; an extrinsic base formed in the semiconductor surface adjacent to the intrinsic base; and a conducting region formed in contact with the extrinsic base but with an edge closest to the emitter which is separated from the intrinsic base.

Typically, the semiconductor surface in the bipolar transistor is a surface of a monocrystalline silicon substrate containing impurities of a first dopant type; the intrinsic base is a region containing an impurity of a second dopant type formed in the semiconductor surface; the emitter comprises a first polysilicon region overlying the intrinsic base; and conducting region comprises a second polysilicon region. The extrinsic base may be aligned either with an edge of the emitter or an edge of the insulating spacer.

BRIEF DESCRIPTION OF THE DRAWINGS

Similar or identical items in different figures have the same reference symbols.

DETAILED DESCRIPTION OF THE PREFERRED EMBODIMENTS

In accordance with an embodiment of the present invention, a bipolar transistor is formed using a double-poly process. A first polysilicon (polycrystalline silicon) layer forms an emitter of the transistor. A second polysilicon layer forms a self-aligned polysilicon base contact. To form the self-aligned base contact, a portion of the second polysilicon layer is covered by silicon nitride sidewall spacers on a step of the emitter, and a protective oxide layer is grown on the portion of the second polysilicon layer not covered silicon nitride sidewall spacers. A selective etch removes the nitride sidewall spacers but leaves the protective oxide layer. The uncovered portion of the second polysilicon layer is then removed to isolate the self-aligned polysilicon base contacts from the emitter.

Because the polysilicon base contact is self aligned, the layout of the bipolar transistor does not require tolerances for misalignment between masks. Accordingly, using the same design rules and lithoghapic equipment, active regions of a bipolar transistor in accordance with the present invention can be made smaller than active regions of prior art bipolar transistors which do not have self-aligned contacts. A further advantage of the double-poly process disclosed is its similarity to processes for forming field effect transistors such as described in U.S. patent application entitled "Self-aligned Source/Drain Polysilicon or Polysilicide Contacts in Field Effect Transistors", incorporated by reference above. The disclosed double-poly process is highly compatible with CMOS processes and easily incorporated in formation of Bi-CMOS integrated circuits.

Figure 1:
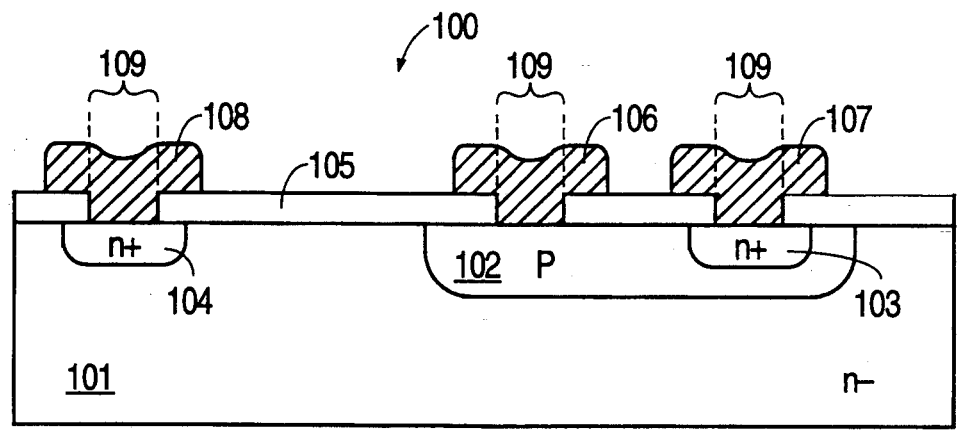
FIG. 1 shows a cross-sectional view of a prior art bipolar transistor.
Figure 2:
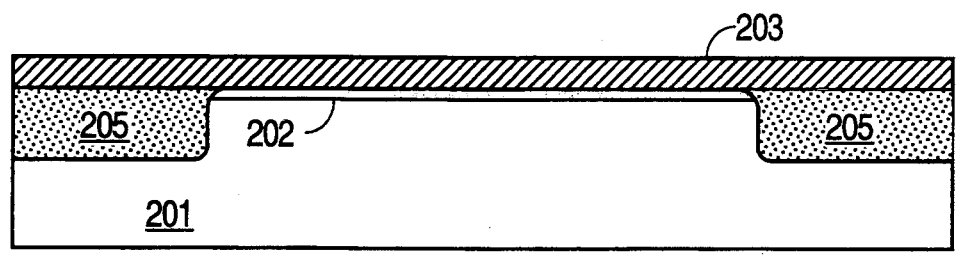
FIG. 2 shows a shows a cross-sectional view of a structure including a substrate with an intrinsic base implanted and a first polysilicon layer used to form portions of a bipolar transistor in accordance with the present invention.

A process for forming a bipolar transistor in accordance with another embodiment of the present invention is illustrated by FIGS. 2-7. FIG. 2 shows a shows a cross-sectional view of a structure including a semiconductor substrate 201 and a first polysilicon layer 203 which form portions of a bipolar transistor in accordance with the present invention. In this embodiment, substrate 201 is a monocrystalline silicon substrate containing an N type dopant such as arsenic. Substrate 201 has been processed using well known techniques such as formation an epitaxial monocrystalline silicon layer overlying a buried N+ layer (not shown). Substrate 201 is also masked, and field oxide regions 205 are thermally grown to help isolate an active region 202 from circuit elements (not shown) formed elsewhere on the surface of substrate 201. A P type dopant such as boron has been introduced into active region 202 using conventional techniques such as ion implantation or diffusion to form an initial intrinsic base. Typically, active region 202 is lightly doped having a dopant concentration between approximately $1 \times 10^{17}$ and $5 \times 10^{18}$ cm$^{-3}$ to an initial thickness between about 0.05 and 0.1 $\mu$m.

An ultra-thin interfacial oxide layer about 1 to 4 nm thick may be on the surface of region 202. The interfacial oxide layer may be an unavoidable native oxide layer or a precisely controlled layer intentionally formed using a process such as described in U.S. patent application entitled "Low Temperature Process for Growing Thermal Oxide Layers" which was incorporated by reference above. A precisely control ultra-thin oxide layer between an emitter and a substrate is believed to improve the gain of a bipolar transistor. However, for applications which require low emitter resistance, low noise, or improved transistor matching characteristics, the native oxide layer may be broken down in a rapid thermal anneal (RTA) after formation of polysilicon layer 203. An RTA exposes substrate 201 to a temperature of about 1050° C. for between 10 and 30 seconds.

A polysilicon layer 203 is formed on substrate 201 to a thickness between about 0.2 and 0.3 µm using well known chemical vapor deposition (CVD) techniques. Polysilicon layer 203 is implanted or diffused with an N type dopant such as arsenic to a dopant concentration of between about $1 \times 10^{20}$ and about $1 \times 10^{21}$ cm$^{-3}$. A silicide layer may be formed on emitter 303 to reduce emitter resistance and prepare the emitter for metal contacts.

Figure 3:
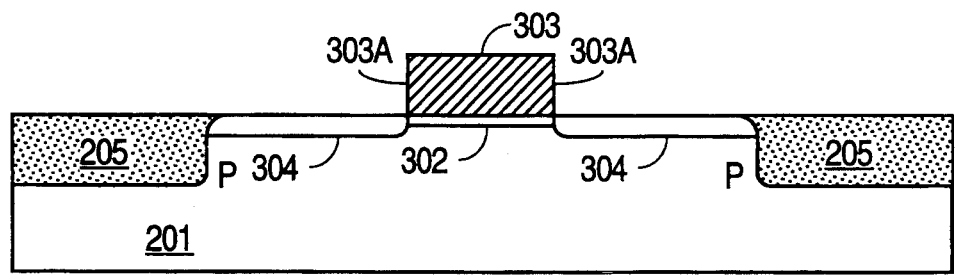
FIG. 3 shows a cross-sectional view of the structure of FIG. 2 after masking and etching to form a polysilicon emitter.

FIG. 3 shows a cross-sectional view of the structure of FIG. 2 after masking and etching polysilicon layer 203 to form a polysilicon emitter 303. The masking may be preformed using well known photolithography techniques. The size of the emitter 303 depends on the lithography equipment and the design rules used. A conventional anisotropic etching technique such as reactive ion etching (RIE) or plasma etching removes unwanted polysilicon and leaves polysilicon emitter 303. RIE forms sidewalls 303A which are nearly perpendicular to the surface of substrate 201 and therefore facilitates formation of a spacer (disclosed below) on sidewalls 303A.

A P type implant forms an initial link base 304. Link base 304 has a higher dopant concentration than an intrinsic base 302 which underlies emitter 303. The implant uses polysilicon emitter 303 as a mask. Accordingly, link base 304 is aligned with the edges of emitter 303 and is adjacent and electrically coupled to intrinsic base region 302. Link base 304 acts as part of a link-up region between intrinsic base 302 and a polysilicon base contact (disclosed below). It is believed that most of the current from emitter 303 to substrate 201, an underlying buried region (not shown), and a collector (not shown) flows through the intrinsic base 302. Typically, link base 304 has a dopant concentration between about $1 \times 10^{18}$ to about $1 \times 10^{19}$ cm$^{-3}$ and an initial depth between about 0.1 and about 0.2 µm. In some embodiments, link base 304 is not formed at this point but is formed later in the process. For example, an link base may be formed either after formation of spacers or as part of an extrinsic base formed by diffusion from a second polysilicon layer as disclosed below.

Figure 4:
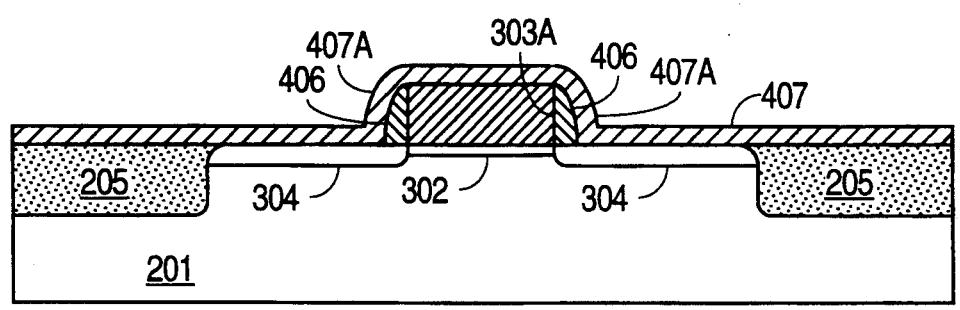
FIG. 4 shows a cross-sectional view of the structure of FIG. 3 after formation of a first spacer and a second polysilicon layer.

A spacer 406 in FIG. 4 is formed on sidewalls 303A of emitter 303. Such spacers are commonly referred to as sidewall spacers. In the embodiment shown, spacer 406 is made of silicon dioxide and may be formed by depositing an oxide layer between about 0.2 and 0.3 µm thick using CVD and then etching the oxide layer using an anisotropic etch such as RIE employing CHF$_3$ and O$_2$, CF$_4$ and H$_2$, or CHF$_3$ and C$_2$F$_6$ to remove most of the oxide layer. The greater thickness (along the direction of the anisotropic etch) of the oxide layer adjacent to emitter 303 causes the anisotropic etch to leave spacer 406 when the rest of the oxide layer is removed. As mentioned above, link base 304 may be formed at this point using polysilicon emitter 303 and spacer 406 as a mask for ion implantation or diffusion of P type dopants.

A conductive layer 407 is deposited to a thickness between about 0.15 and about 0.3 µm over link base 304, spacer 406, and emitter 303. In the embodiment shown conductive layer 407 is a polysilicon layer formed using well known CVD techniques. Optionally, a silicide layer can be formed on the top surface of polysilicon layer 407 to reduce resistance and condition polysilicon layer 407 for metal contacts disclosed below. Polysilicon layer 407 is then implanted with a P type dopant to concentration of between about $1 \times 10^{19}$ and $1 \times 10^{21}$ cm$^{-3}$ which makes polysilicon layer 407 conductive.

In an alternative embodiment, conductive layer 407 may be silicon (Si), amorphous silicon (α-Si), microcrystalline silicon (µ-Si), polysilicide, silicide (WSi$_x$, TiSi$_x$, CoSi$_x$, MoSi$_x$, etc.), or another conductive material. A silicide conductive layer 407 may be formed by sputtering from a compound silicon target or CVD. Polysilicide is formed from a polysilicon layer 407 using well known techniques such as sputtering or evaporating a thin layer of metal onto a silicon layer 407 and then heating to form silicide where the metal is in contact with the silicon.

Figure 5:
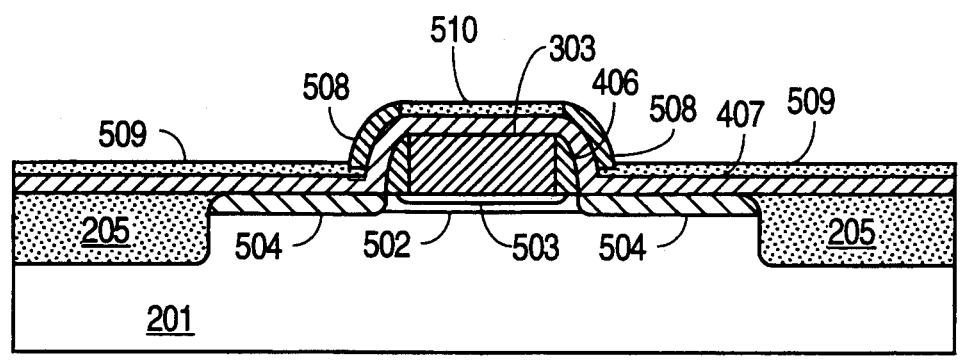
FIG. 5 shows a cross-sectional view of the structure of FIG. 4 after formation of a second spacer and a protective layer on the second polysilicon layer.

Because the contour of layer 407 follows the underlying structure, there is a step in layer 407 in a region overlying emitter 303. A second spacer 508 is formed on sidewalls 407A of the step in polysilicon layer 407 as shown in FIG. 5. In the embodiment of FIG. 5, spacer 508 is silicon nitride. Such spacers may be formed by CVD of a 500 Å layer of silicon nitride then an anisotropic etch of the silicon nitride layer to expose portions of polysilicon layer 407. RIE using an etch such as a mixture of Cl$_2$ and O$_2$, or CHF$_3$ and O$_2$, or SF$_6$ and O$_2$ which etches silicon nitride faster than polysilicon, provides the desired spacer 508.

After formation of spacer 508, a protective layer including regions 509 and 510 are formed on exposed portions of polysilicon layer 407. In the embodiment of FIG. 5, the protective layer and regions 509 and 510 are silicon dioxide which is thermally grown on polysilicon layer 407. Thermal oxide does not grow on nitride spacer 508.

The thermal process which forms oxide regions 509 and 510 causes diffusion of dopants from emitter 303 and polysilicon layer 407. N type diffusion from polysilicon emitter 303 forms a heavily dope N+ emitter region 503 having a depth of about 0.1 to 0.2 µm in substrate 201. Emitter 303 follows the contour of substrate 201 and has a relatively uniform dopant concentration. Accordingly, emitter region 503 is uniform even if emitter 303 is small. In some prior art processes, an emitter is formed from a second polysilicon layer partly overlying a base contact so that the emitter has a step, and the emitter's thickness along the direction of an ion implant varies. If the emitter is too small, the variation in thickness along the direction of the ion implant causes uneven doping of the prior art emitters and a non-uniform emitter region in an underlying substrate. The yield of operable transistors is decreased by non-uniformity in the emitters. This decrease in yield is known as the "narrow emitter effect." Bipolar transistors in accordance with this embodiment of the present invention do not suffer from the narrow emitter effect.

P type dopants in intrinsic base 302 and link base 304 of FIG. 4 migrate to a depth of about 0.2 to 0.3 µm in substrate 201 to form an intrinsic base 502. The dopant concentration of intrinsic base 502 is highest under spacer 406 because dopants in that region are predominantly from link base 304 rather than initial intrinsic base 302. P type dopants from link base 304 and from polysilicon layer 407 diffuses to a depth of about 0.4 to 0.6 µm in substrate 201 to form extrinsic base 504. The dopant concentration of extrinsic base 504 is increased by diffusion of P type atoms from polysilicon layer 407.

To control the amount of diffusion, a high pressure oxidation (HIPOX) process can be used. HIPOX reduces the time required to grow protective regions 509 and 510 and thereby limits the amount of diffusion. For example, the oxide layer may be grown by exposing polysilicon layer 407 (and the rest of the structure shown in FIG. 5) to oxygen or water vapor at 10 to 25 atmospheres and 850° to 950° C. for about 1 to 10 minutes.

Figure 6:
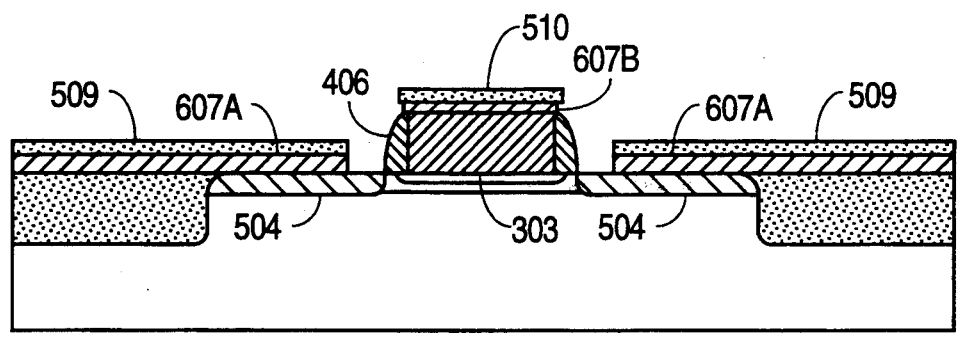
FIG. 6 shows a cross-sectional view of the structure of FIG. 5 after etching to remove the second spacer and portions the second polysilicon layer under the second spacer.
Figure 7:
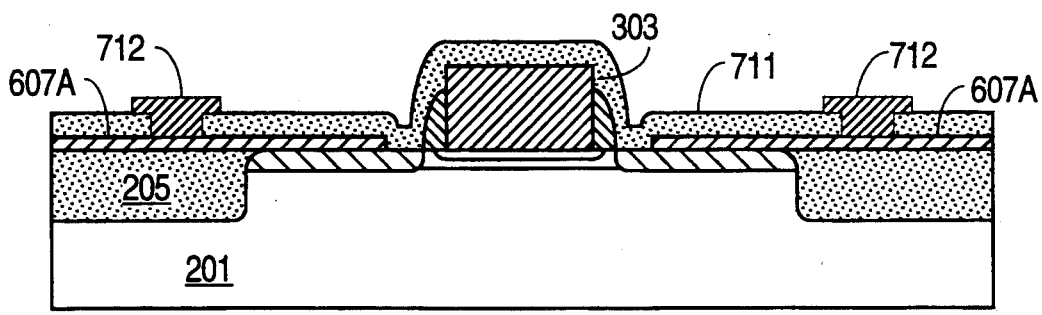
FIG. 7 shows a cross-sectional view of the structure of FIG. 6 after formation of an insulating layer and metal contacts.

Silicon nitride spacer 508 is removed using an etch such as hot (150° to 180° C.) phosphoric acid ($H_3PO_4$) which is selective to silicon dioxide so that protective regions 509 and 510 remain substantially intact. Removing nitride spacer 508 exposes a portion of polysilicon layer 407 which was adjacent to and below spacer 508. The exposed portion of polysilicon layer 407 is removed using an isotropic etch such as a wet etch or a plasma etch to electrically isolate polysilicon base contact 607A from emitter 303 as shown in FIG. 6. Polysilicon region 607B becomes part of polysilicon emitter 303 or optionally may be removed. Removal can be accomplished for example by adding a layer of planarized photoresist or spin-on glass which protects lower regions of the structure shown in FIG. 6 while the higher regions (510 and 607B) are removed.

A low temperature oxide (LTO) layer 711 approximately 0.2 to 0.4 μm thick is then deposited by CVD over polysilicon base contact 607A, substrate 201, and polysilicon emitter 303. Openings for metal contacts including metal base contacts 712 are then formed through oxide layer 711. Silicide can be formed on silicon exposed by the openings before metal is deposited. Such formation of silicide may not be necessary if silicide was previously formed on layer 407 as disclosed above in regard to FIG. 4. Finally metal base contact 712, emitter contact 813, and collector contact 814 are formed using well known techniques. Contacts 712, 813, and 814 permit electrical connections to polysilicon base contact 607A, emitter 303, and a collector region (not shown) in substrate 201.

Figure 8A:
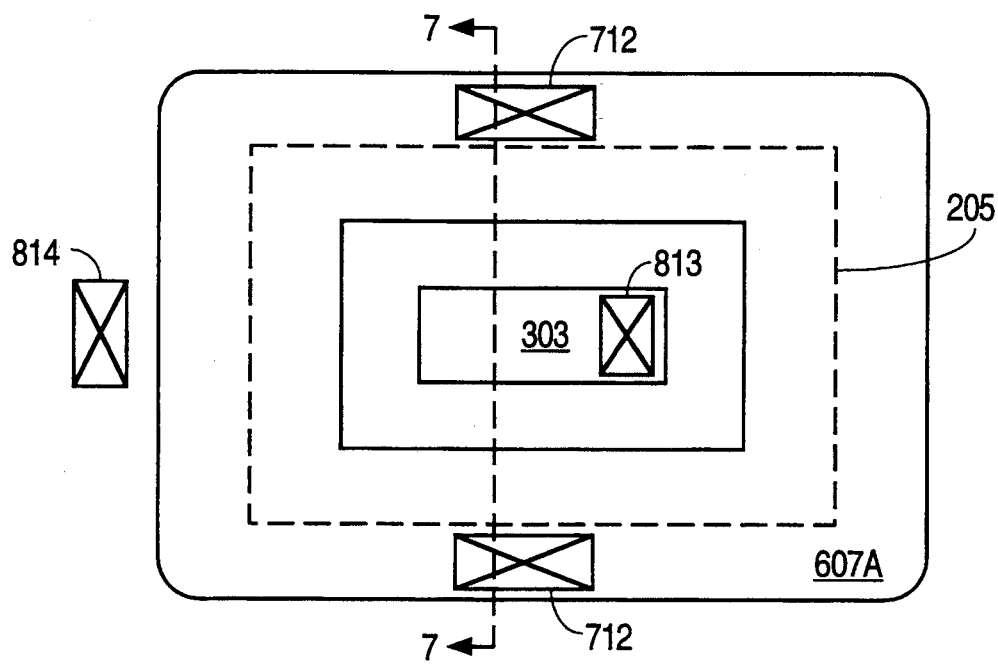
FIGS. 8A and 8B show top views of a bipolar transistors in accordance with the present invention.
Figure 8B:
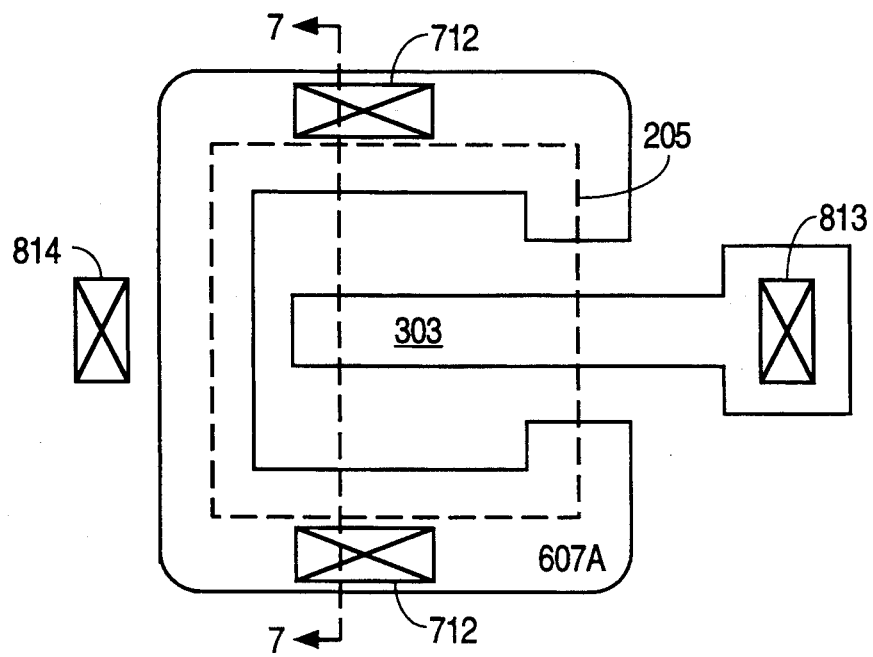

FIGS. 8A and 8B show examples transistor geometries for emitter 303, base contact 607A, and field oxidation 205 in accordance with the invention. FIG. 8A shows the relative positions of base contact 712, emitter contact 813, and collector contact 814 when emitter 303 is large enough that emitter contact 813 can be formed over the active region. FIG. 8B shows the relative positions of base contact 712, emitter contact 813, and collector contact 814 when emitter contact 813 is formed over field oxidation 205. Forming base contacts 712 over the field oxide instead of over active regions permits the active regions to be made smaller. Additionally, collector-base junction capacitance is reduced by having metal contacts 712 further from the active regions and each other and on top of the field oxide which has a higher dielectric constant than silicon.

Figure 9:
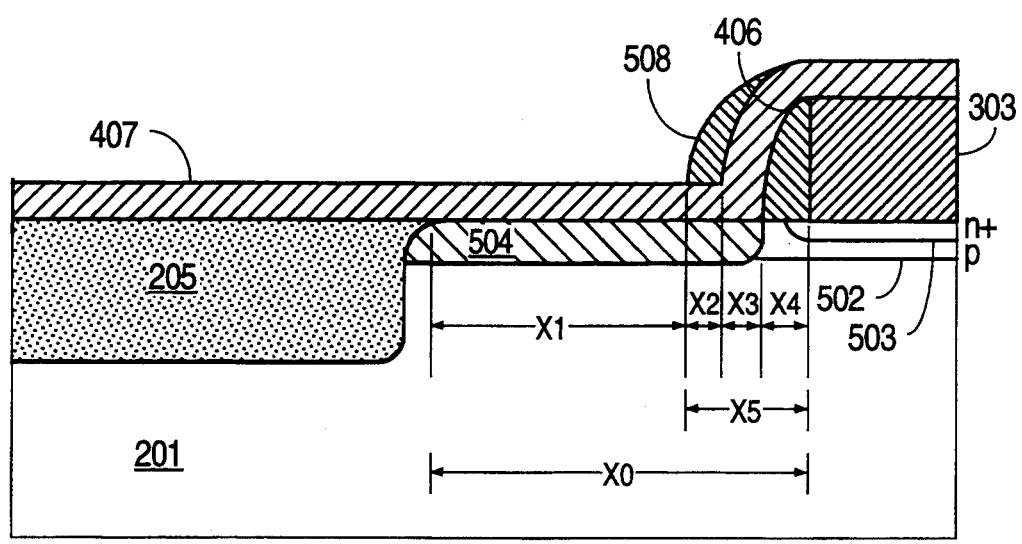
FIG. 9 shows a expanded portion of the cross-sectional view of FIG. 5.

FIG. 9 shows an expanded portion of FIG. 5 and indicates a typical spacing achievable in a bipolar transistor in accordance with the invention. In FIG. 9, spacer 4.06 has a width X4 of about 0.2 μm. Polysilicon layer 407 and spacer 508 have respective widths X3 and X2 of 0.15 and 0.05 μm. As disclosed above with regard to FIGS. 5 and 6, spacer 508 and the potions of layer 407 under spacer 508 are etched away leaving a total distance X5 of about 0.4 μm between polysilicon base contact 607A and polysilicon emitter 303. The distance X5 is not subject to variations caused by alignment errors between masks because spacers 508 and 406 are self-aligned with emitter 303 and define the location of base contact 607A. The precision of the distance X5 is limited by the precision of the thickness of layer 407 and spacer 508 and the precision of the etching techniques used to remove spacer 508 and the underlying regions of polysilicon layer 407.

It should also be noted that the edge of extrinsic base 504 closest to emitter 303 is aligned with a fixed offset of about 0.2 μm from the edge of the polysilicon base contact 607A.

The distance X0 from the edge of isolation region 205 to the edge of emitter 303 is about 0.7 μm and is subject to alignment error between a mask for field oxide region 205 and a mask for polysilicon emitter 303. Accordingly, the length X1 of contact between polysilicon contact 607A and extrinsic base 504 is about 0.3 μm and is subject to alignment error. However, for symmetric transistors having base contacts on either side of the transistor such as shown in FIG. 8, alignment error reducing the contact area on one side of the emitter tends to increase the contact area on the opposite side.

Although the present invention has been described with reference to particular embodiments, the description is only an example of the invention's application and should not be taken as a limitation. In particular, even though much of preceding disclosure was directed to an NPN bipolar transistor formed in the surface of a monocrystalline silicon substrate, the present invention is not so limited. In light of the above disclosure, it will be understood by those skilled in the art that PNP bipolar transistors can also be formed in accordance with the present invention. Further, bipolar transistors are not limited to being formed in the surface of monocrystalline silicon. Transistors in accordance with the present invention can be formed in polycrystalline silicon and other semiconductor materials including for example, gallium-arsenide. In addition, although the disclosed embodiments employ a first spacer that is silicon dioxide, a second spacer that is silicon nitride, and a protective silicon dioxide layer that covers portions of the base contact layer not covered by the second spacer, embodiments of the present invention are not limited to these materials. In another embodiment, the second spacer and the protective layer are formed using materials such that a selective etch is available to remove the second spacer without removing the protective layer. The first spacer can generally be made of any insulating material or can be omitted completely. If the first spacer is omitted, a suitable material such as a reoxidation layer can be provided on the walls of the emitter to prevent etching of the emitter when the base contacts are isolated from the emitter. It will also be understood that the order of processing steps disclosed may be varied from the disclosed order when practicing processes in accordance with the present invention. Accordingly, various modifications, adaptations, substitutions and combinations of different features of the specific embodiments can be practiced without departing from the scope of the invention set forth in the appended claims.

We claim:

1. A process for making a bipolar transistor, comprising the steps of:
    forming an emitter on a semiconductor surface;
    forming a first spacer on a sidewall of the emitter;

forming an extrinsic base in the semiconductor surface;

forming a conductive silicon layer in contact with the extrinsic base and overlying the first spacer and the emitter such that a step is formed in the conductive silicon layer in a region near the emitter and the first spacer;

forming a second spacer on a sidewall of the step;

forming a protective layer on a portion of the conductive layer not covered by the second spacer;

removing the second spacer to expose a portion of the conductive silicon layer covered by the second spacer but leave covered by the portion of the conductive silicon layer covered by the protective layer; and removing the exposed portion of the conductive silicon layer to leave a portion of the conductive silicon layer in contact with the extrinsic base and electrically isolated from the emitter.

2. The process of claim 1, wherein the step of forming an emitter comprises the steps of:

depositing a polysilicon layer on the semiconductor surface;

doping the polysilicon layer with an impurity of a first dopant type;

masking the polysilicon layer to protect a first region of the polysilicon layer and leave exposed a second region of the polysilicon layer; and etching the polysilicon layer to remove the second region but leave the first region.

3. The process of claim 2, wherein the step of forming the conductive silicon layer comprises the steps of:

depositing a second polysilicon layer, the second polysilicon layer being in contact with the extrinsic base and overlying the semiconductor surface and the emitter; and doping the polysilicon layer with an impurity of a second dopant type.

4. The process of claim 3, further comprising the step of forming a silicide on the second polysilicon layer.

5. The process of claim 3, wherein the step of forming a second spacer comprises the steps of:

depositing a layer of silicon nitride on the second polysilicon layer; and anisotropically etching the silicon nitride layer to remove silicon nitride from a portion of the second polysilicon layer.

6. The process of claim 5, wherein the step of forming a protective layer comprises the step of thermally growing a silicon dioxide on the portion of the second polysilicon layer not cover by the second spacer.

7. The process of claim 3, wherein the step of forming the extrinsic base further comprises the step of diffusing some of the impurity from the second polysilicon layer into the semiconductor surface.

8. The process of claim 1, wherein the second spacer comprises silicon nitride, and the protective layer comprises silicon dioxide.

9. The process of claim 1, wherein the step of forming the extrinsic base further comprises the step of using the emitter and the first spacer as a mask for controlling implantation of an impurity into the semiconductor surface.

10. The process of claim 9 further comprising the step of doping the conductive silicon layer with an impurity, wherein the step of forming the extrinsic base further comprises the step of diffusing some of the impurity from the conductive silicon layer into the semiconductor surface.

11. The process of claim 1, wherein the step of forming the extrinsic base further comprises the step of using the emitter as a mask for controlling implantation of an impurity into the semiconductor surface.

12. The process of claim 11, further comprising the step of doping the conductive silicon layer with an impurity, wherein the step of forming the extrinsic base further comprises the step of diffusing some of the impurity from the conductive silicon layer into the semiconductor surface.

13. A process for making a bipolar transistor, comprising the steps of:

forming an emitter on a semiconductor surface;

forming an extrinsic base using the emitter as a mask for controlling implantation of an impurity into the semiconductor surface;

forming a first spacer on a sidewall of the emitter;

forming a conductive layer in contact with the extrinsic base and overlying the first spacer and the emitter such that a step is formed in the conductive layer in a region near the emitter and the first spacer;

forming a second spacer on a sidewall of the step;

forming a protective layer on a portion of the conductive layer not covered by the second spacer;

removing the second spacer to expose a portion of the conductive layer covered by the second spacer but leave covered the portion of the conductive layer covered by the protective layer; and removing the exposed portion of the conductive layer to leave a portion of the conductive layer in contact with the extrinsic base and electrically isolated from the emitter.

14. The process of claim 13, further comprising the step of doping the conductive layer with an impurity, wherein the step of forming the extrinsic base further comprises the step of diffusing some of the impurity from the conductive layer into the semiconductor surface.

15. A process for making a bipolar transistor, comprising the steps of:

forming an emitter on a semiconductor surface;

forming a first spacer on a sidewall of the emitter;

forming an extrinsic base in the semiconductor surface;

forming a conductive layer by depositing a silicide layer in contact with the extrinsic base and overlying the semiconductor surface, the first spacer, and the emitter such that a step is formed in the conductive layer in a region near the emitter and the first spacer;

forming a second spacer on a sidewall of the step;

forming a protective layer on a portion of the conductive layer not covered by the second spacer;

removing the second spacer to expose a portion of the conductive layer covered by the second spacer but leave covered the portion of the conductive layer covered by the protective layer; and removing the exposed portion of the conductive layer to leave a portion of the conductive layer in contact with the extrinsic base and electrically isolated from the emitter.

16. The process of claim 15, wherein the step of depositing a silicide layer comprises sputtering from a target which comprises a metal-silicon compound.

17. A process for making a bipolar transistor, comprising the steps of:

forming an emitter on a semiconductor surface;

forming a first spacer on a sidewall of the emitter;

forming an extrinsic base in the semiconductor surface;

forming a conductive layer in contact with the extrinsic base and overlying the first spacer and the emitter such that a step is formed in the conductive layer in a region near the emitter and the first spacer;

forming a second spacer on a sidewall of the step, wherein the second spacer comprises a sidewall spacer formed by depositing of a layer of spacer material over the conductive layer and anisotropically etching the layer of spacer material;

forming a protective layer on a portion of the conductive layer not covered by the second spacer;

removing the second spacer to expose a portion of the conductive layer covered by the second spacer but leave covered the portion of the conductive layer covered by the protective layer; and removing the exposed portion of the conductive layer to leave a portion of the conductive layer in contact with the extrinsic base and electrically isolated from the emitter.

18. The process of claim 17, wherein the layer of spacer material comprises a layer of silicon nitride deposited on the conductive layer.

19. The process of claim 18, wherein the step of forming a protective layer comprises the step of thermally growing oxide on the portion of the conductive layer not cover by the second spacer.

* * * * *